(12) United States Patent
Lee

(10) Patent No.: US 7,564,090 B2
(45) Date of Patent: Jul. 21, 2009

(54) TRANSISTOR OF A SEMICONDUCTOR DEVICE

(75) Inventor: Sang Don Lee, Kyungki-Do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 190 days.

(21) Appl. No.: 11/656,582

(22) Filed: Jan. 22, 2007

(65) Prior Publication Data

US 2007/0114595 A1     May 24, 2007

Related U.S. Application Data

(62) Division of application No. 11/007,918, filed on Dec. 9, 2004, now Pat. No. 7,189,618.

(30) Foreign Application Priority Data

Jul. 21, 2004     (KR) ............................... 2004-56904

(51) Int. Cl.
*H01L 27/108* (2006.01)
(52) U.S. Cl. ...................................... 257/314; 438/201
(58) Field of Classification Search ................. 257/321, 257/324, 314
See application file for complete search history.

(56) References Cited

U.S. PATENT DOCUMENTS

| | | | |
|---|---|---|---|
| 5,838,041 A | 11/1998 | Sakagami et al. | ............ 257/324 |
| 6,238,978 B1 | 5/2001 | Huster | |
| 6,255,165 B1 * | 7/2001 | Thurgate et al. | ............ 438/257 |
| 6,271,094 B1 * | 8/2001 | Boyd et al. | .................. 438/287 |
| 6,352,895 B1 | 3/2002 | Lam | |
| 2002/0072170 A1 | 6/2002 | Lam | ........................... 438/239 |
| 2002/0146886 A1 | 10/2002 | Chern | |
| 2004/0183106 A1 * | 9/2004 | Kim et al. | ................... 257/239 |

FOREIGN PATENT DOCUMENTS

CN     1482654     3/2004

OTHER PUBLICATIONS

Ogura et al., "Embedded Twin MONOS Flash Memories with 4ns and 15ns Fast Access Times," Symposium on VLSI Circuit Digest of Technical Papers, pp. 207-210 (2003).

* cited by examiner

*Primary Examiner*—Thao X Le
*Assistant Examiner*—Matthew Gordon
(74) *Attorney, Agent, or Firm*—Marshall, Gerstein & Borun LLP

(57) ABSTRACT

Disclosed are a semiconductor device and a method of manufacturing the same. According to the present invention, the transistor of the semiconductor device comprises a stack type gate in which a tunnel oxide film, a floating gate, a dielectric film and a control gate are sequentially stacked on a semiconductor substrate, a gate oxide film that is formed on the semiconductor substrate below the floating gate with respect to the tunnel oxide film, wherein the gate oxide film is formed along the boundary of some of the bottom and side of the floating gate, and floating nitride films that are buried at gaps between the gate oxide film formed on the semiconductor substrate and the gate oxide film formed along the boundary of some of the bottom and side of the floating gate, wherein the floating nitride films serve as a trap center of a hot charge and store 1 bit charge. The transistor of the semiconductor device can operate as a 2-bit or 3-bit cell transistor.

19 Claims, 6 Drawing Sheets

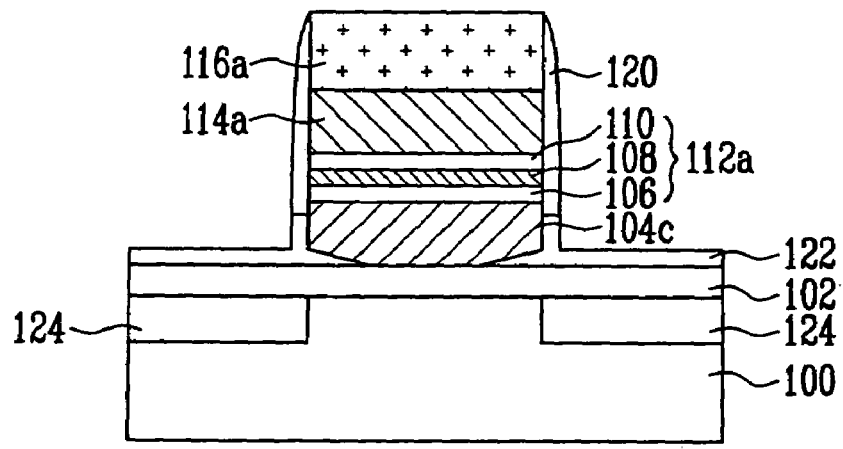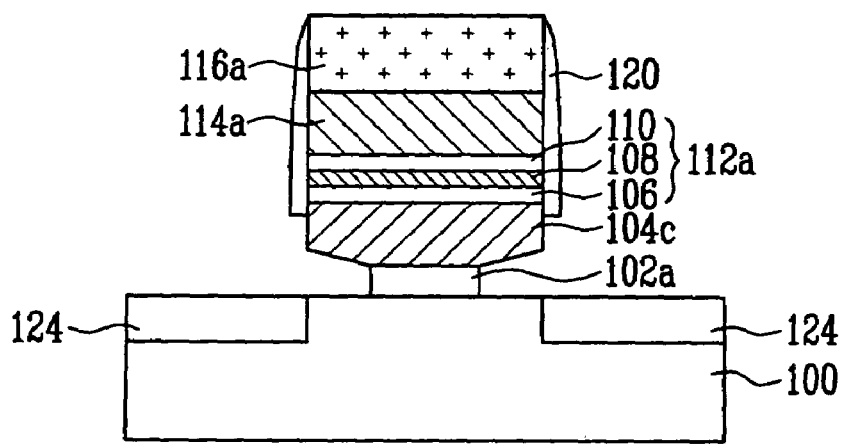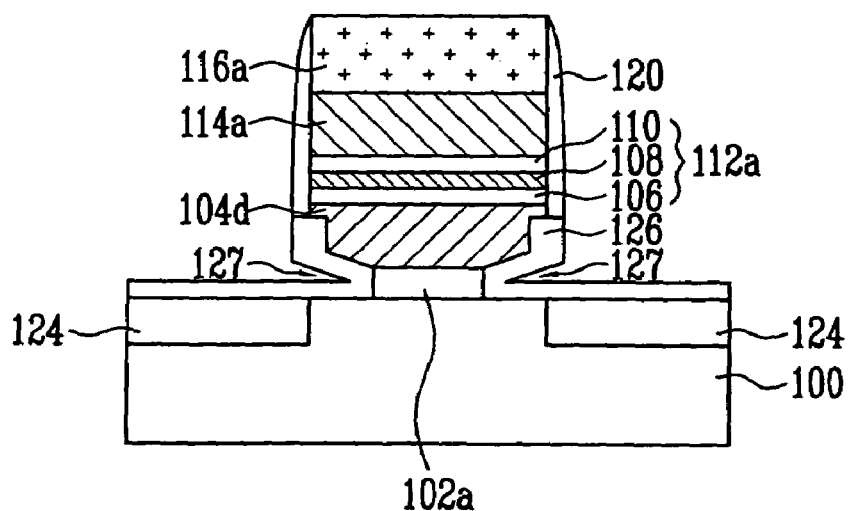

TRANSISTOR OF A SEMICONDUCTOR DEVICE

CROSS-REFERENCE TO RELATED APPLICATION

This is a division of copending, commonly assigned application Ser. No. 11/007,918 filed Dec. 9, 2004, the disclosure of which is incorporated herein by reference.

BACKGROUND OF THE DISCLOSURE

1. Field of the Invention

The present invention relates to a semiconductor device and a method of manufacturing the same, and more specifically, to a transistor of a semiconductor device which can operate as a 2-bit or 3-bit cell transistor and a method of manufacturing the same.

2. Discussion of Related Art

Semiconductor memory devices are typically classified into a volatile memory in which stored information is deleted as the supply of power is stopped, and a non-volatile memory in which information is kept although the supply of power is stopped. The non-volatile memory devices may include EPROM (Erasable Programmable Read Only Memory), EEPROM (Electrically Erasable Programmable Read Only Memory), a flash Memory, and the like. Programmable Read Only Memory), EEPROM (Electrically Erasable Programmable Read Only Memory), a flash Memory, and the like.

The flash memory device is classified into a NOR type flash memory device and a NAND type flash memory device depending upon the configuration of cells. In the flash memory device, a memory cell that stores data includes cell transistors. Each of the cell transistors includes a control gate and a floating gate. The flash memory device requires some time in storing information since the information is stored using tunneling phenomenon through an insulating film. The NOR type flash memory device is typically used to read a small amount of information in a non-sequential manner at high speed, whereas the NAND type flash memory device is usually used to read information in a sequential manner. However, in a method of storing 1 bit in one cell, the same number of a cell as the level of integration is needed as the degree of integration of a flash memory cell increases. That is, a 64 Mb flash memory device requires $2^{26}$ cells. Thus, in order to solve this problem, a multi level cell (MLC) has been developed. A method has been developed in which the threshold voltage $V_t$ of the flash memory cell is divided to display states without variations in the flash cell structure. This method has been also developed for a NAND type flash memory device as well as a NOR type flash memory device.

FIG. 1 is a cross-sectional view showing the configuration of a transistor of a typical flash memory device.

Referring to FIG. 1, a conventional stack gate type cell transistor includes a tunnel oxide film 12 formed on a semiconductor substrate 10, a floating gate 14 formed on the tunnel oxide film 12, a dielectric film 22 formed on the floating gate, a control gate 24 formed on the dielectric film 22, a capping film 26 formed on the control gate, and a source/drain region 32 that is formed parallel to the floating gate 14 and over the semiconductor substrate 10 formed below the tunnel oxide film 12. The dielectric film 22 has an ONO (Oxide-Nitride-Oxide) structure in which a first oxide film 16, a nitride film 18 and a second oxide film 20 are sequentially stacked. A thermal oxide film 28 is formed at both sides of the floating gate 14, the dielectric film 22 and the control gate 24.

Spacers 30 are formed at the sidewalls of the thermal oxide film 28 and the capping film 26.

In this stack gate type cell transistor, the floating gate 14 is a place where electrons or holes are stored and is insulated by the tunnel oxide film 12 and the dielectric film 22. If electrons are stored in the floating gate 14, the threshold voltage of the stack gate type cell transistor increases. On the contrary, if holes are stored in the floating gate 14, the threshold voltage of the stack gate type cell transistor decrease. Assuming that a state where electrons are stored is defined to be "0" and a state where electrons are not stored is defined to be "1" (or vice versa), data of "0" or "1" that is stored in the floating gate 14 can be normally read in an unlimited manner and the data can be kept completely even when power is out. Therefore, this stack gate type cell transistor can be used as a flash memory cell.

As only one "0" or "1" can be stored in one stack gate type cell transistor, however, this stack gate type cell transistor operates only as single-bit transistor. Accordingly, transistors as many as the number of data to be stored are needed.

SUMMARY OF THE DISCLOSURE

A transistor of a semiconductor device includes a stack type gate in which a tunnel oxide film, a floating gate, a dielectric film and a control gate are sequentially stacked on a semiconductor substrate. The transistor also includes a gate oxide film that is formed on the semiconductor substrate below the floating gate with respect to the tunnel oxide film, wherein the gate oxide film is formed along the boundary of a portion of the bottom and side of the floating gate. Furthermore, the transistor also includes floating nitride films that are buried at gaps between the gate oxide film formed on the semiconductor substrate and the gate oxide film formed along the boundary of a portion of the bottom and side of the floating gate, wherein the floating nitride films serve as a trap center of a hot charge and store 1 bit charge.

According to another embodiment, a transistor of a semiconductor device includes a stack type gate in which a tunnel oxide film, a floating gate, a dielectric film and a control gate are sequentially stacked on a semiconductor substrate. The transistor also includes first spacers formed on sidewalls of a portion of the floating gate, the dielectric film and the control gate, and a gate oxide film formed at a portion of the bottom and side of the floating gate and on the semiconductor substrate. Furthermore, the transistor also includes floating nitride films in which gaps are formed between the gate oxide film formed at a portion of the bottom and side of the floating gate and the gate oxide film formed on the semiconductor substrate, wherein the floating nitride films are buried in the gaps. Still further, the transistors include second spacers that are formed on sidewall of the first spacers, the gate oxide film formed at a portion of the bottom and side of the floating gate, and the floating nitride film.

According to still another embodiment, a transistor of a semiconductor device includes a stack type gate in which a tunnel oxide film, a floating gate, a dielectric film and a control gate are sequentially stacked on a semiconductor substrate. The transistor also includes first spacers formed on sidewalls of some of the floating gate, the dielectric film and the control gate, and a thermal oxide film formed on the semiconductor substrate at the bottom of a first side of the floating gate. Furthermore, the transistor also includes a gate oxide film formed at a portion of the bottom and side of the first side of the floating gate and on the thermal oxide film, wherein the gate oxide film is also formed at a portion of the bottom and side of a second side of the floating gate and on the semiconductor substrate at the bottom of the second side of the floating gate. Still further, the transistor includes floating nitride films in which gaps are formed between the gate oxide film formed at a portion of the bottom and side of the second side of the floating gate and the gate oxide film formed on the semiconductor substrate at the bottom of the second side of the floating gate, wherein the floating nitride films are buried in the gaps. Additionally, the transistor includes second spacers formed on the first spacer and the thermal oxide film at the first side of the floating gate and formed on sidewalls of the first spacer at the second side of the floating gate, the gate oxide film formed at the bottom and side of the floating gate and the floating nitride film.

A method of manufacturing a transistor of a semiconductor device includes forming a tunnel oxide film on a semiconductor substrate, stacking a floating gate, a dielectric film, a control gate and a capping film on the tunnel oxide film and patterning the floating gate, the dielectric film, the control gate and the capping film to form a stack type gate. The floating gate is partially patterned so that a predetermined thickness remains. The method also includes forming first spacers on sidewalls of the capping film, the control gate, the dielectric film and the floating gate, etching the remaining floating gate using the capping film and the first spacer as an etch mask, and growing an oxide film on the tunnel oxide film and at the side of the floating gate to form a thermal oxide film that is infiltrated into the bottom of the floating gate at a given depth. Additionally, the method includes removing the tunnel oxide film at the bottom of the thermal oxide film and the thermal oxide film, and forming gaps of a predetermined shape between a gate oxide film formed at the side and bottom of the floating gate and a gate oxide film formed on the semiconductor substrate, while growing a gate oxide film at the side and bottom of the exposed floating gate and on the semiconductor substrate. Furthermore, the method includes depositing a nitride film on the semiconductor substrate on which the gate oxide films are grown, to form floating nitride films to bury the gaps, and forming second spacers on sidewalls of the first spacers, the gate oxide film and the floating nitride film.

According to another embodiment, a method of manufacturing a transistor of a semiconductor device includes forming a tunnel oxide film on a semiconductor substrate, stacking a floating gate, a dielectric film, a control gate and a capping film on the tunnel oxide film and patterning the floating gate, the dielectric film, the control gate and the capping film to form a stack type gate. The floating gate is partially patterned so that a predetermined thickness remains. The method also includes forming first spacers on sidewalls of the capping film, the control gate, the dielectric film and the floating gate, etching the remaining floating gate using the capping film and the first spacer as an etch mask, and growing an oxide film on the tunnel oxide film and at the side of the floating gate to form a thermal oxide film that is infiltrated into the bottom of the floating gate at a given depth. Additionally, the method includes shielding a first side of the stack type gate, and removing the thermal oxide film formed at a second side of the stack type gate and the tunnel oxide film at the bottom of the thermal oxide film, and growing a gate oxide film on the thermal oxide film exposed at the first side of the stack type gate and at the side and at the bottom of the floating gate, and at a second side of the stack type gate, forming gaps of a predetermined shape between a gate oxide film formed at the side and bottom of the floating gate and a gate oxide film formed on the semiconductor substrate, while growing a gate oxide film at the side and bottom of the exposed floating gate and on the semiconductor substrate. Furthermore, the method also includes depositing a nitride film on the semiconductor substrate on which the gate oxide film is grown and etching the nitride film to form a floating nitride film that buries the gaps, and forming second spacers on sidewalls of the first spacers, the gate oxide film and the floating nitride film.

BRIEF DESCRIPTION OF THE DRAWINGS

FIGS. 4 to 12 are cross-sectional views showing steps of a method of manufacturing a transistor of a semiconductor device according to a first embodiment of the present invention;

DETAILED DESCRIPTION OF PREFERRED EMBODIMENTS

Figure 1:
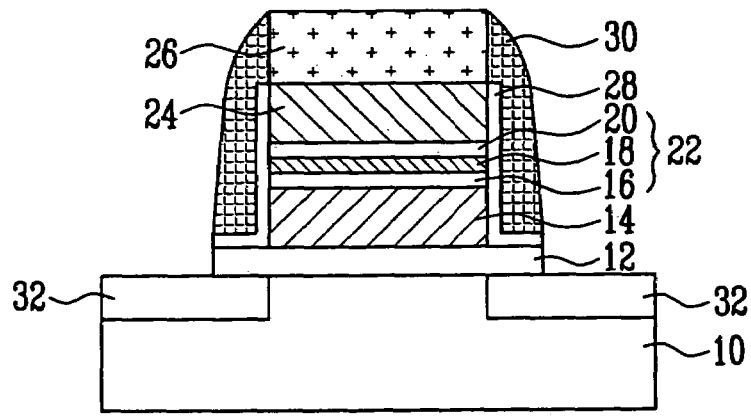
FIG. 1 is a cross-sectional view showing the configuration of a transistor of a common flash memory device.

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later. Meanwhile, in case where it is described that one film is "on" the other film or a semiconductor substrate, the one film may directly contact the other film or the semiconductor substrate. Or, a third film may be intervened between the one film and the other film or the semiconductor substrate. Further, in the drawing, the thickness and size of each layer are exaggerated for convenience of explanation and clarity. Like reference numerals are used to identify the same or similar parts.

Figure 2:
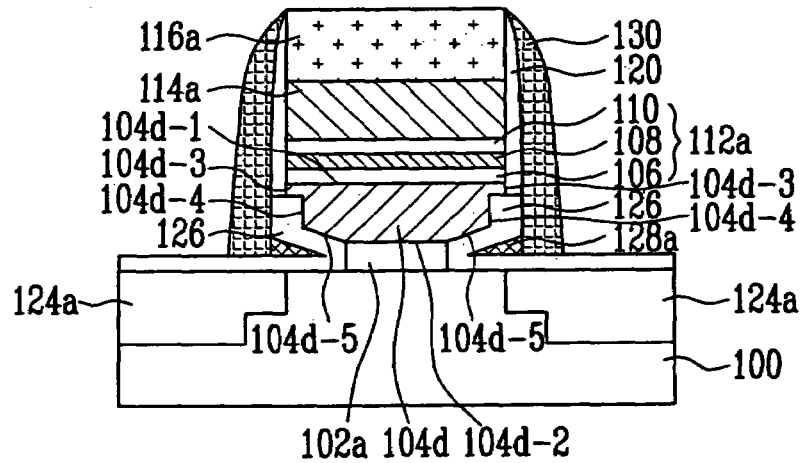
FIG. 2 is a view for explaining a transistor of a semiconductor device according to a first embodiment of the present invention.

FIG. 2 is a view for explaining a transistor of a semiconductor device according to a first embodiment of the present invention.

Referring to FIG. 1, the transistor of the semiconductor device according to the first embodiment of the present invention includes a stack type gate of a structure in which a tunnel oxide film 102a, a floating gate 104d, a dielectric film 112a, a control gate 114a and a capping film 116a are sequentially stacked on a semiconductor substrate 100. First spacers 120 are formed at some of the side of the floating gate 104d and at the side of the dielectric film 112a and the control gate 114a. Gate oxide films 126 are formed at some of the bottom and side of the floating gate 104d and over the semiconductor substrate 100. The floating gate 104d is insulated by the tunnel oxide film 102a, the gate oxide films 126, the dielectric film 112a and the first spacers 120. Gaps are formed between the gate oxide films 126 that are formed at some of the bottom and side of the floating gate 104d and the gate oxide films 126 formed on the semiconductor substrate 100. Nitride films 128a are formed in the gaps. The nitride films are surrounded by the gate oxide films 126, and they thus exist as nitride films (hereinafter, referred to as 'floating nitride film') in a floating shape. The floating nitride films 128a may have a lied right-angled triangle. Second spacers 130 are formed adjacent to the gate oxide films 126 formed at some of the bottom and side of the floating gate 104d, the floating nitride films 128a and the first spacer 120. The floating nitride films 128a are completely isolated by the gate oxide films 126 and the second spacers 130. The dielectric film 112a may have an ONO (Oxide-Nitride-Oxide) structure in which the first oxide film 106, the nitride film 108 and the second oxide film 110 are stacked sequentially.

The bottom of the first spacers 120 is located at a place that is lower than the top 104d-1 of the floating gate and is located at a place that is higher than the bottom 104d-2 of the floating gate.

First sides 104d-3 at both sides of the floating gate 104d are formed adjacent to the first spacer 120. A width between second sides 104d-4 at both sides of the floating gate 104d is smaller than that between the first sides 104d-3. The second sides 104d-4 come in contact with the gate oxide films 126. The bottom 104d-2 has a plane adjacent to the tunnel oxide film 102a. Faces 104d-5 between the bottom 104d-2 and the second sides 104d-4 are inclined at a predetermined tilt. The faces between the first side 104d-2 and the second side 104d-3 of the floating gate and the bottom of the first spacer 120 are located on the same plane.

The gate oxide films 126 are formed at the bottom and the side of the floating gate 104d, and over the semiconductor substrate 100. The gate oxide films 126 are formed adjacent to the bottom of the first spacer 120, the face between the first side 104d-3 and the second side 104d-4, the face 104d-5 between the second side 104d-4, the bottom 104d-2 and the second side 104d-4, and the tunnel oxide film 102a.

The transistor of the semiconductor device according to the first embodiment of the present invention can serve as a 3-bit cell transistor. 1-bit charge can be stored in the floating gate 104d of the transistor according to the first embodiment of the present invention by means of the F-N (Fowler Nordheim) tunneling effect that tunnels the tunnel oxide film 102a. The gate oxide films 126-the floating nitride films 128a-the gate oxide films 126 is formed between the semiconductor substrate 100 and some of the side and bottom of the floating gate 104d. The floating nitride films 128a can serve as a trap center and can thus store 1-bit charge. The floating nitride films 128a are formed under the both sides of the floating gate 104d, respectively. 1-bit charge can be stored in the floating nitride films 128a. Accordingly, the transistor according to an embodiment of the present invention has a structure in which 3-bit charge can be stored by the floating gate 104d and the floating nitride films 128a formed under both sides of the floating gate 104d. In other words, the transistor according to an embodiment of the present invention has a structure in which an ONO film (the gate oxide films 126-the floating nitride films 128a-the gate oxide films 126) that is formed at the bottom of the first side of the stack type gate using the stack type gate as a common electrode, the tunnel oxide film 102a formed at the bottom of the stack type gate, and an ONO film (the gate oxide films 126-the floating nitride films 128a-the gate oxide films 126) formed at the bottom of the second side of the stack type gate constitute transistors, respectively, i.e., three transistors are connected serially. The three transistors that are serially connected have the same stack type gate electrode.

Therefore, assuming that a state where electrons are stored in the floating gate 104d is defined to be "0" and a state where electrons are not stored in the floating gate 104d is defined to be "1" (or vice versa), the transistor of the present invention can be used as bit-1. Electrons can be injected into or deleted from the floating gate 104d through the tunnel oxide film 102a by means of the F-N tunneling effect. Further, if electrons are stored in the floating nitride films 128a located under both sides of the floating gate 104d, the threshold voltage of the stack type gate transistor increases. If electrons are not stored in the floating nitride films 128a, the threshold voltage of the stack type gate transistor decreases. Therefore, assuming that a state where electrons are stored in the floating nitride films 128a are defined to be "0" and a state where electrons are not stored in the floating nitride films 128a are defined to be "1" (or vice versa), the floating nitride films 128a can operate as bit-2 or bit-3. It is thus possible to inject/delete electrons into/from the floating nitride films 128a by means of the hot electron or hot hole method. Accordingly, the transistor according to the first embodiment of the present invention can operate as the 3-bit cell transistor.

Hereinafter, read and write operations of the transistor according to the first embodiment of the present invention will be described.

Table 1 below shows the operation of the 3-bit cell transistor according to the first embodiment of the present invention. In Table 1, $V_{PG1}>V_{PG2} \approx V_{PG3}>V_{GG}$ and $V_{PD2} \geqq V_{PD1}>V_{DD}$. (As used herein, the symbol "$\approx$" means approximately equal to or the image of.)

TABLE 1

|  |  | Control Gate | Drain | Source | Semiconductor Substrate |
|---|---|---|---|---|---|
| Read |  | $V_{GG}$ | $V_{DD}$ | 0 V | 0V or $-V_{BB}$ |
| Write "0" | bit-1 | $V_{PG1}$ | 0 V | 0 V | 0V or $-V_{BB}$ |
|  | bit-2 | $V_{PG2}$ | $V_{PD1}$ | 0 V | 0V or $-V_{BB}$ |
|  | bit-3 | $V_{PG2}$ | 0 V | $V_{PD1}$ | 0V or $-V_{BB}$ |
| Write "1" | bit-1 | $-V_{PG1}$ | 0 V | 0 V | 0V or $-V_{BB}$ |
|  | bit-2 | $-V_{PG3}$ | $V_{PD2}$ | 0 V or floating | 0V or $-V_{BB}$ |
|  | bit-3 | $-V_{PG3}$ | 0 V or floating | $V_{PD2}$ | 0V or $-V_{BB}$ |

In the write operation (Write "0" in Table 1), if the first program voltage $+V_{PG1}$ is applied to the control gate 114a, 0V is applied to the source and drain electrode 124a and 0V or the back bias voltage $-V_{BB}$ is applied to the semiconductor substrate 100, electrons are injected from the semiconductor substrate 100 or the source/drain electrode 124a to the floating gate 104d by means of the F-N tunneling effect. (see "bit-1" in Table 1). Also, if the second program voltage $+V_{PG2}$ is applied to the control gate 114a, the first drain voltage $+V_{PD1}$ is applied to the drain electrode 124a, 0V is applied to the source electrode 124a and 0V or the back bias voltage $-V_{BB}$ is applied to the semiconductor substrate 100, electrons of high energy are generated from the drain electrode 124a and hot electrons are thus injected from a region around the drain to the floating nitride films 128a located around the drain by means of an electric field of the control gate 114a (see "bit-2" in Table 1). Moreover, if the second program voltage $+V_{PG2}$ is applied to the control gate 114a, 0V is applied to the drain electrode 124a, the first drain voltage $+V_{PD1}$ is applied to the source electrode 124a and 0V or the back bias voltage $-V_{BB}$ is applied to the semiconductor substrate 100, electrons of high energy are generated form the source electrode 124a and hot electrons are thus injected from a region around the source to the floating nitride films 128a located around the source by means of an electric field of the control gate 114a (see "bit-3" in Table 1).

In the write operation (Write "1" in Table 1), if the negative first program voltage $-V_{PG1}$ is applied to the control gate 114a, 0V is applied to the drain and source electrode 124a, and 0V or the back bias voltage $-V_{BB}$ is applied to the semiconductor substrate 100, electrons in the floating gate 104d exit to the semiconductor substrate 100 or the source/drain electrode 124a and holes thus remain in the floating gate 104d (see "bit-1" in Table 1). Also, if the negative third program voltage $-V_{PG3}$ is applied to the control gate 114a, the second drain voltage $+V_{PD2}$ is applied to the drain electrode 124a, the source electrode 124a is applied with 0V or floated, and 0V or the back bias voltage $-V_{BB}$ is applied to the semiconductor substrate 100, holes of high energy are generated from the drain electrode 124a and are thus injected from a region around the drain to the floating nitride films 128a by means of an electric field of the control gate 114a (see "bit-2" in Table 1). Moreover, if the negative third program voltage $-V_{PG3}$ is applied to the control gate 114a, the drain electrode 124a is applied with 0V or floated, the second drain voltage $+V_{PD2}$ is applied to the source electrode 124a, and 0V or the back bias voltage $-V_{BB}$ is applied to the semiconductor substrate 100, holes of high energy are generated from the source electrode 124a and are thus injected from a region around the source to the floating nitride films 128a by means of an electric field of the control gate 114a (see "bit-3" in Table 1).

Figure 3:
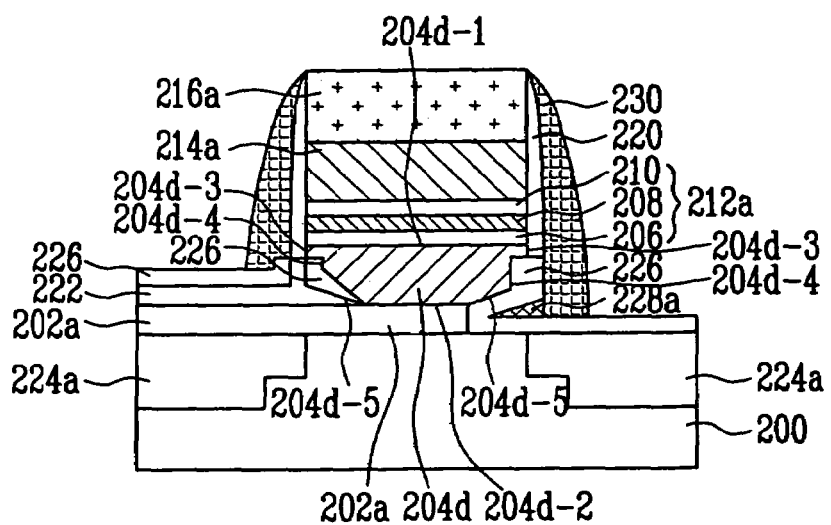
FIG. 3 is a view for explaining a transistor of a semiconductor device according to a second embodiment of the present invention.

FIG. 3 is a view for explaining a transistor of a semiconductor device according to a second embodiment of the present invention.

Referring to FIG. 3, the transistor of the semiconductor device according to the second embodiment of the present invention includes a stack type gate of a structure in which a tunnel oxide film 202a, a floating gate 204d, a dielectric film 212a, a control gate 214a and a capping film 216a are sequentially stacked on a semiconductor substrate 200. First spacers 220 are formed at some of the side of the floating gate 204d, and at the side of the dielectric film 212 and the control gate 214a. At a first side of the stack type gate (left side with respect to the stack type gate), a thermal oxide film 222 is formed on the tunnel oxide film 202a, and gate oxide films 226 are formed at some of the side of the thermal oxide film 222 and at some of the bottom and side of the floating gate 204d. At a second side of the stack type gate (right side with respect to the stack type gate), gate oxide films 226 are formed at some of the bottom and side of the floating gate 204d and over the semiconductor substrate 200. The floating gate 204d is insulated by the tunnel oxide film 202a, the gate oxide films 226, the dielectric film 212a and the first spacer 220. At the second side of the stack type gate, Gaps are formed between the gate oxide films 226 that are formed at some of the bottom and side of the floating gate 204d and the gate oxide films 226 formed on the semiconductor substrate 200. Nitride films 228a are formed at the gaps. At the first side of the stack type gate, second spacers 230 are formed adjacent to the gate oxide films 226 formed at some of the bottom and side of the floating gate 204d, the floating nitride film 228a and the first spacer 220. At the second side of the stack type gate, the floating nitride film 228a is completely isolated by the gate oxide films 226 and the second spacers 230. The dielectric film 212a may have an ONO (Oxide-Nitride-Oxide) structure in which the first oxide film 206, the nitride film 208 and the second oxide film 210 are stacked sequentially.

The bottom of the first spacer 220 is located at a place that is lower than the top 204d-1 of the floating gate and is located at a place that is higher than the bottom 204d-2 of the floating gate.

First sides 204d-3 at both sides of the floating gate 204d are formed adjacent to the first spacer 220 and the second sides 204d-4 are formed adjacent to the gate oxide films 226. A width between the second sides 204d-4 at both sides of the floating gate 204d is smaller than that between the first sides 204d-3. The bottom 204d-2 has a plane adjacent to the tunnel oxide film 204a. Faces 204d-5 between the bottom 204d-2 and the second side 204d-4 are inclined at a predetermined tilt. The faces between the first side 204d-2 and the second side 204d-3 of the floating gate and the bottom of the first spacer 220 are located on the same plane.

At the second side of the stack type gate, the gate oxide films 226 are formed at some of the bottom and side of the floating gate 204d, and over the semiconductor substrate 200. The gate oxide films 226 are formed adjacent to the bottom of the first spacer 220, the face between the first side 204d-3 and the second side 204d-4, the face 204d-5 between the second side 204d-4, the bottom 204d-2 and the second side 204d-4, and the tunnel oxide film 204a. At the first side of the stack type gate, the gate oxide films 226 are formed at some of the bottom and side of the floating gate 204d and over the thermal oxide film 222. The gate oxide films 226 are formed to come into contact with the face between the first side 204d-3 and the second side 204d-4, and the face 204d-5 between the second side 204d-4, the bottom 204d-2 and the second side 204d-4.

The transistor of the semiconductor device according to the second embodiment of the present invention can serve as a 2-bit cell transistor. 1-bit charge can be stored in the floating gate 204d of the transistor according to the second embodiment of the present invention by means of the F-N (Fowler Nordheim) tunneling effect that tunnels the tunnel oxide film 204a. At the second side of the stack type gate, the gate oxide films 226-the floating nitride film 228a-the gate oxide films 226 is formed between the semiconductor substrate 200 and some of the side and bottom of the floating gate 204d. The floating nitride film 228a can serve as a trap center and thus store 1-bit charge. The floating nitride film 228a is formed under the side of the floating gate 204d and 1-bit charge is stored in the floating nitride film 228a. Accordingly, the transistor according to the second embodiment of the present invention has a structure in which 2-bit charge can be stored by means of the floating gate 204d and the floating nitride film 228a formed under the side of the floating gate 204d. In other words, the transistor according to the embodiment of the present invention has a structure in which the ONO film (the gate oxide films 226-the floating nitride film 228a-the gate oxide films 226) that is formed under the side of the first side of the stack type gate using the stack type gate as a common electrode, and the tunnel oxide film 202a formed under the stack type gate form transistors, respectively, i.e., two transistors are connected serially. The two transistors that are serially connected have the same stack type gate electrode.

Therefore, assuming that a state where electrons are stored in the floating gate 204d is defined to be "0" and a state where electrons are not stored in the floating gate 204d is defined to be "1" (or vice versa), the transistor of the present invention can be used as bit-1. Electrons can be injected into or deleted from the floating gate 204d through the tunnel oxide film 202a by means of the F-N tunneling effect. Further, if electrons are stored in the floating nitride film 228a located under the side of the floating gate 204d, the threshold voltage of the stack type gate transistor increases. On the contrary, if electrons are not stored in the floating nitride film 228a, the threshold voltage of the stack type gate transistor decreases. Therefore, assuming that a state where electrons are stored in the floating nitride film 228a is defined to be "0" and a state where electrons are not stored in the floating nitride film 228a is defined to be "1" (or vice versa), the floating nitride film 228a can operate as bit-2. It is thus possible to inject/delete electrons into/from the floating nitride film 228a by means of the hot electron or hot hole method. Accordingly, the transistor according to the second embodiment of the present invention can operate as the 3-bit cell transistor.

Read and write operations of the transistor according to the second embodiment of the present invention will now be described.

Table 2 shows the operation of the 2-bit cell transistor according to the second embodiment of the present invention. In Table 2, $V_{PG1} > V_{PG2} \approx V_{PG3} > V_{GG}$ and $V_{PD2} \geq V_{PD1} > V_{DD}$.

TABLE 2

|  |  | Control Gate | Drain | Source | Semiconductor Substrate |
|---|---|---|---|---|---|
| Read |  | $V_{GG}$ | $V_{DD}$ | 0 V | 0V or $-V_{BB}$ |
| Write "0" | bit-1 | $V_{PG1}$ | 0 V | 0 V | 0V or $-V_{BB}$ |
|  | bit-2 | $V_{PG2}$ | $V_{PD1}$ | 0 V | 0V or $-V_{BB}$ |
| Write "1" | bit-1 | $-V_{PG1}$ | 0 V | 0 V | 0V or $-V_{BB}$ |
|  | bit-2 | $-V_{PG3}$ | $V_{PD2}$ | 0 V or Floating | 0V or $-V_{BB}$ |

In the write operation (Write "0" in Table 2), if the first program voltage $+V_{PG1}$ is applied to the control gate 214a, 0V is applied to the source and drain electrode 224a and 0V or the back bias voltage $-V_{BB}$ is applied to the semiconductor substrate 200, electrons are injected from the semiconductor substrate 200 or the source/drain electrode 224a to the floating gate 204d by means of the F-N tunneling effect. (see "bit-1" in Table 2). Also, if the second program voltage $+V_{PG2}$ is applied to the control gate 214a, the first drain voltage $+V_{PD1}$ is applied to the drain electrode 224a, 0V is applied to the source electrode 224a and 0V or the back bias voltage $-V_{BB}$ is applied to the semiconductor substrate 200, electrons of high energy are generated from the drain electrode 224a and hot electrons are then injected from a region around the drain to the floating nitride film 228a around the drain by means of an electric field of the control gate 214a (see "bit-2" in Table 2).

In the write operation ("1" in Table 2), if the negative first program voltage $-V_{PG1}$ is applied to the control gate 214a, 0V is applied to the drain and source electrode 224a, and 0V or the back bias voltage $-V_{BB}$ is applied to the semiconductor substrate 200, electrons in the floating gate 204d exit toward the semiconductor substrate 200 or the source/drain electrode 224a and holes thus remain in the floating gate 204d (see "bit-1" in Table 2). Further, if the negative third program voltage $-V_{PG3}$ is applied to the control gate 214a, the second drain voltage $+V_{PD2}$ is applied to the drain electrode 224a, the source electrode 224a is applied with 0V or floated, and 0V or the back bias voltage $-V_{BB}$ is applied to the semiconductor substrate 200, holes of high energy are generated from the drain electrode 224a and are thus injected from a region around the drain to the floating nitride film 228a by means of an electric field of the control gate 214a. (see "bit-2" in Table 2).

A method of manufacturing a transistor of a semiconductor device according to preferred embodiments of the present invention will now be described.

FIGS. 4 to 12 are cross-sectional views showing steps of a method of manufacturing a transistor of a semiconductor device according to a first embodiment of the present invention.

Figure 4:
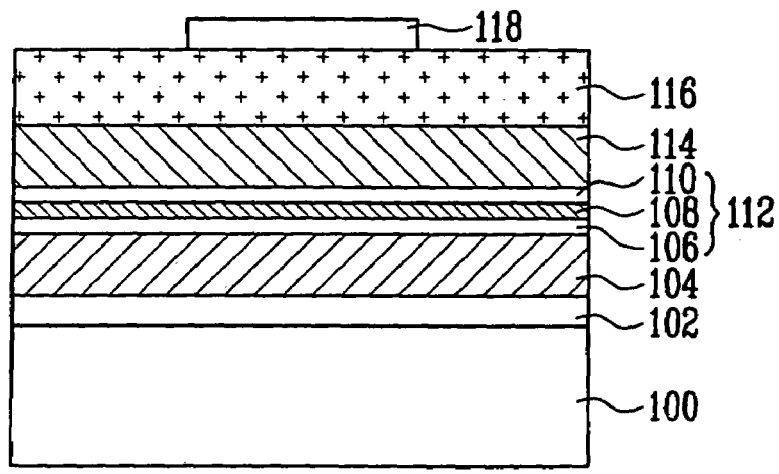

Referring to FIG. 4, a semiconductor substrate 100 is prepared. The semiconductor substrate 100 can be a P-type or N-type substrate. Though not shown in the drawing, a well (not shown) can be formed in the semiconductor substrate 100. Also, although not shown in the drawing, an isolation film (not shown) that defines an active region can be formed in the semiconductor substrate 100. The isolation film is formed by means of LOCOS (Local Oxidation of Silicon) or a trench isolation process. A tunnel oxide film 102 is formed on the semiconductor substrate 100. The tunnel oxide film 102 can be formed by means of a wet or dry oxidization process.

A material film 104 for floating gate is deposited on the semiconductor substrate 100 in which the tunnel oxide film 102 is formed. The material film 104 for floating gate can be formed using a polysilicon film. The polysilicon film may be formed using a $SiH_4$ or $Si_2H_6$ and $PH_3$ gas by means of a low pressure-chemical vapor deposition (LP-CVD) method. For example, the polysilicon film can be formed at a temperature ranging from approximately 580 to 620° C. and a low pressure ranging from approximately 0.1 to 3 Torr.

A dielectric film 112 is formed on the material film 104 for floating gate. The dielectric film 112 can have an ONO (Oxide-Nitride-Oxide) structure in which the first oxide film 106, the nitride film 108 and the second oxide film 110 are stacked sequentially. The first and second oxide films 106 and 110 of the dielectric film 112 can be formed using high temperature oxide (HTO) using a $SiH_2Cl_2$ (dichlorosilane, DCS) and $H_2O$ gas as a source gas. Further, the first and second oxide films 106 and 110 can be formed by means of a wet or dry oxidization process. The nitride film 108 of the dielectric film 112 can be formed at a low pressure ranging from approximately 0.1 to 3 Torr and a temperature ranging from approximately 650 to 800° C. by means of a LP-CVD method using a $NH_3$ and $SiH_2Cl_2$(dichlorosilane; DCS) gas as a reaction gas.

A material 114 for control gate is deposited on the dielectric film 112. The material film 114 for control gate can be formed using a polysilicon film. The polysilicon film can be formed using a thin amorphous silicon film that is deposited, e.g., at a temperature of approximately 510° C. to 550° C. and a low pressure of approximately 0.1 to 3 Torr.

Though not shown in the drawing, a silicide film can be formed on the material film 114 for control gate. The silicide film can be formed using a tungsten silicide film.

A capping film 116 is formed on the material film 114 for control gate. The capping film 116 can be formed using a silicon nitride film ($Si_3N_4$), a silicon oxynitride film (SiON), a silicon oxide film ($SiO_2$) or the like.

Figure 5:
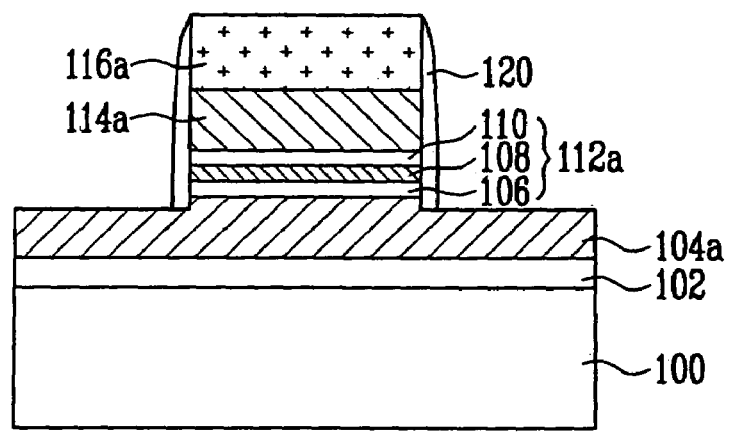

Referring to FIG. 5, the capping film 116, the material film 114 for control gate, the dielectric film 112 and some of the material film 104 for the floating gate are patterned to form a capping film 116a, a control gate 114a, a dielectric film 112a and a floating gate 104a. In the concrete, a photoresist is first coated and is then patterned using a gate mask that defines a gate pattern, thereby forming a photoresist pattern 118. The capping film 116, the material film 114 for control gate, the dielectric film 112 and the material film 104 for floating gate are then sequentially etched using the photoresist pattern 118 as an etch mask. In this time, the material 104 for floating gate is partially etched so that a predetermined thickness remains. The photoresist pattern 118 is then removed. The photoresist pattern 118 can be removed using an ashing process.

After a material film for gate spacer is thinly deposited, a first spacer 120 is formed at the sidewalls of the capping film 116a, the control gate 114a, the dielectric film 112a and some of the floating gate 104a by means of an anisotropic dry etch process. The material film for gate spacer can be a silicon nitride film. The bottom of the first spacer 120 is located at a place that is lower than the top of the floating gate 104 and higher than the bottom of the floating gate 104.

Figure 6:
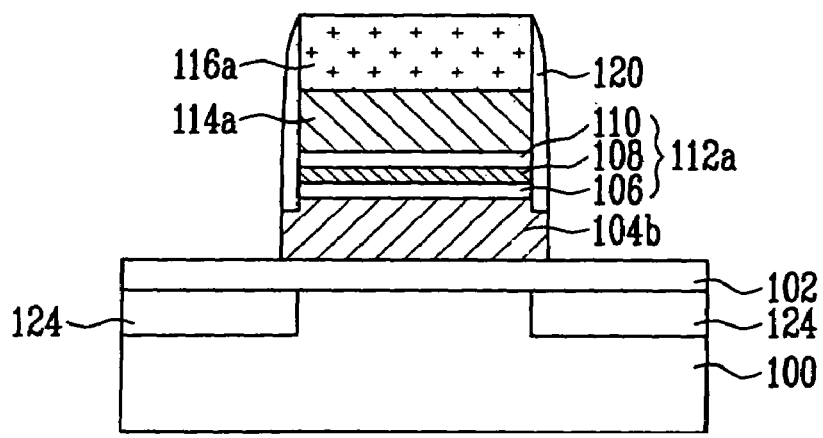

Referring to FIG. 6, the remaining floating gate 104a is etched using the capping film 116a and the spacer 120 as an etch mask.

Referring to FIG. 7, thermal oxide films 122 are grown at the side of the floating gate 104b and on the tunnel oxide film 102. The thermal oxide film 122 also penetrates into the bottom of the floating gate 104b. That is, the oxide film 122 is grown into a given depth from the sidewall of the floating gate 104b. The thermal oxide film 122 can be formed using a wet or dry oxidization process.

An impurity is implanted to form a source/drain electrode 124 in order to form a LDD (Lightly Doped Drain) in a region where a source/drain electrode will be formed. In this time, the impurity can be boron (B), fluoroborate ($BF_2$), phosphor (P), arsenic (As) or the like. For example, the source/drain electrode 124 can be formed by means of an ion implantation process using arsenic (As) at an energy level of 10 to 40 KeV with a dopant doze of $1 \times 10^{13}$ to $5 \times 10^{15}$ atoms/cm$^2$. Meanwhile, the ion implantation process for formation of the LDD can be carried out before the thermal oxide film 122 is formed.

By reference to FIG. 8, the thermal oxide film 122 and the tunnel oxide film 102 below the thermal oxide film 122 are removed by wet etching at the same time. The thermal oxide film 122 that is grown into the bottom of the floating gate at a given portion from the side of the floating gate and the tunnel oxide film 102 below the thermal oxide film 122 are removed by means of the wet etching. The wet etching can be performed using a HF solution having a high etch rate against the oxide films 122, 102 compared to the capping film 116a, the first spacer 120, the floating gate 104c and the semiconductor substrate 100. Although the wet etching is performed, the tunnel oxide film 102a at the bottom of the floating gate 104c remains still.

Referring to FIG. 9, an oxide film is grown at the side and bottom of the exposed floating gate 104c and on the semiconductor substrate 100 to form gate oxide films 126. At this time, it is preferred that the thickness of the gate oxide films 126 that are grown at the side and bottom of the exposed floating gate 104c is thicker than that that is grown on the semiconductor substrate 100. Given gaps 127 are formed between the gate oxide films 126 grown at the side and bottom of the exposed floating gate 104c and the gate oxide films 126 grown on the semiconductor substrate. Further, through formation of the gate oxide films 126, the floating gate 104d has a structure in which first sides at both sides of the floating gate 104d come in contact with the first spacer 120, second sides at both sides of the floating gate 104d, which have a width narrower than that of the first sides, come in contact with the gate oxide films 126, the bottom of the floating gate 104d comes in touch with the tunnel oxide film 102a, and faces between the bottom and the second sides of the floating gate 104d have an inclined shape of a predetermined tilt while coming in contact with the gate oxide films 126. The gate oxide films 126 can be formed by means of a wet or dry oxidization process. For example, the wet oxidization process can be carried out at a temperature ranging from approximately 750° C. to 800° C. and annealing can be performed under a nitrogen (N2) atmosphere at a temperature ranging from approximately 900° C. to 910° C. for 20 to 30 minutes.

Figure 10:
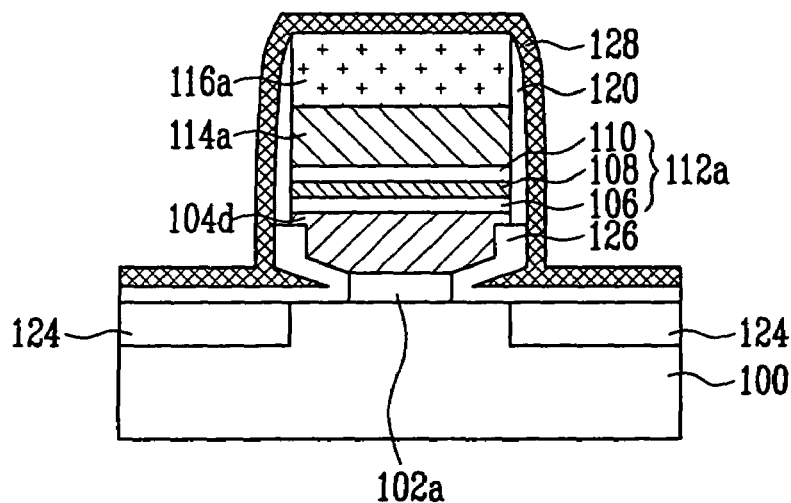

Referring to FIG. 10, a nitride film 128 is deposited on the semiconductor substrate 100 in which the gate oxide films 126 are formed. At this time, the nitride film 128 is also deposited even at the gaps 127 between the gate oxide films 126. The nitride film 128 can be formed by means of a plasma enhanced-chemical vapor deposition (PE-CVD) method. The nitride film 128 can be a silicon nitride film ($Si_3N_4$), and it can be formed using a silane ($SiH_4$) or TEOS (Tetra Ethyl Ortho Silicate) gas as a silicon source gas and $N_2O$, $NH_3$ or a combination of them as a nitrogen source gas. The silicon nitride film can be formed by injecting the silicon source gas and the nitrogen source gas by applying a RF power of approximately 300 to 2000 W at a temperature ranging from approximately 300 to 400° C. and a pressure ranging from approximately 1 to 20 Torr. At this time, the flow rate of the silicon source gas is approximately 5 to 30 sccm and the flow rate of the nitrogen source gas is approximately 10 to 100 sccm. Upon formation of the silicon nitride film, argon (Ar), helium (He), nitrogen ($N_2$) etc. can be used as an ambient gas.

Figure 11:
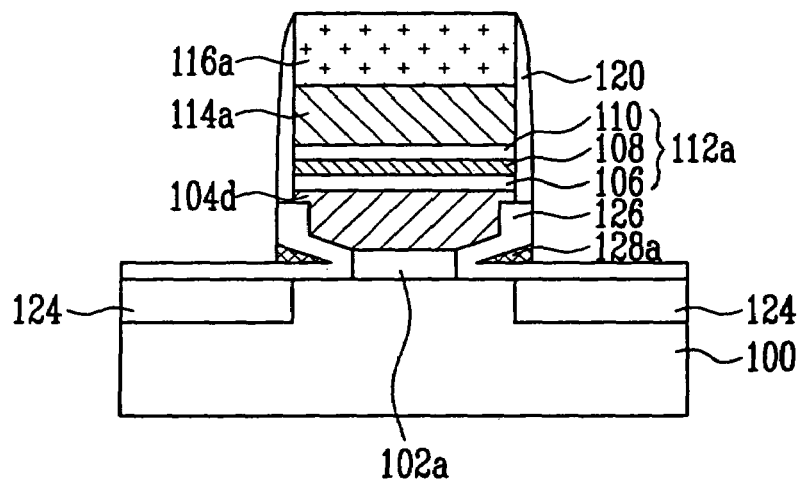

Referring to FIG. 11, the nitride film 128 is etched to leave the nitride film 128 only at the gaps (see '127' in FIG. 9) of the gate oxide films 126. The etching makes the nitride film 128 floated. The nitride film floated thus (hereinafter, referred to as 'floating nitride film') serves as a charge trap center. The etching is preferably wet etching and may employ a phosphoric acid ($H_3PO_4$) solution having a high etch rate against the nitride film compared to the gate oxide films 126.

Figure 12:
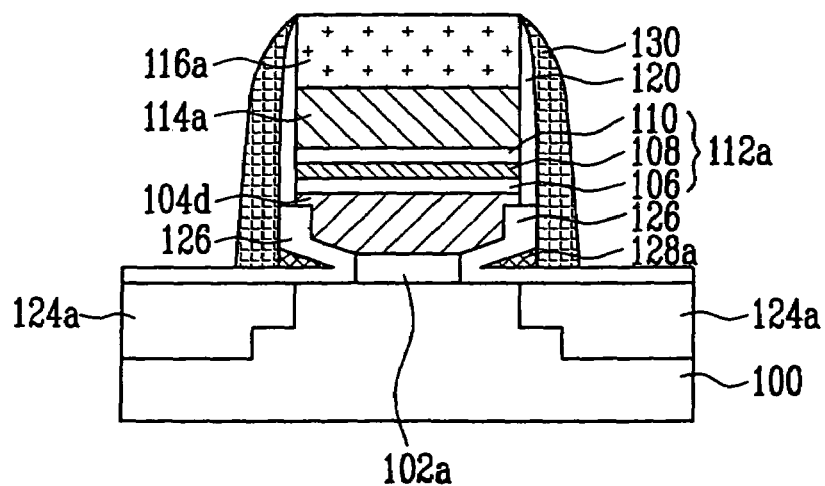

Referring to FIG. 12, after a material film for gate spacer is deposited, anisotropic dry etching is performed to form second spacers 130 on the sidewalls of the first spacer 120, the gate oxide films 126 and the floating nitride films 128a. The material film for gate spacer can be a silicon nitride film. By forming the second spacers 130, the floating nitride films 128a are completely isolated by the gate oxide films 126 and the second spacers 130.

An impurity of a concentration that is higher than that in the ion implantation for formation of the LDD is implanted into the semiconductor substrate 100 in which the second spacers 130 are formed using the capping film 116a and the second spacers 130 as an ion implant mask, thereby forming a source/drain electrode 124a in the source/drain region.

Thereafter, interlayer insulating films (not shown), contacts (not shown) and metal wires (not shown) are formed on the semiconductor substrate 100 in which the cell transistor is formed, thereby completing a desired semiconductor device.

FIGS. 13 to 17 are cross-sectional views showing steps of a method of manufacturing a transistor of a semiconductor device according to a second embodiment of the present invention.

The method of manufacturing the transistor of the semiconductor device according to the second embodiment of the present invention is the same as those of the first embodiment up to the processes described with reference to FIG. 4 to FIG. 7. Description on them will be thus omitted in order to avoid redundancy.

Figure 13:
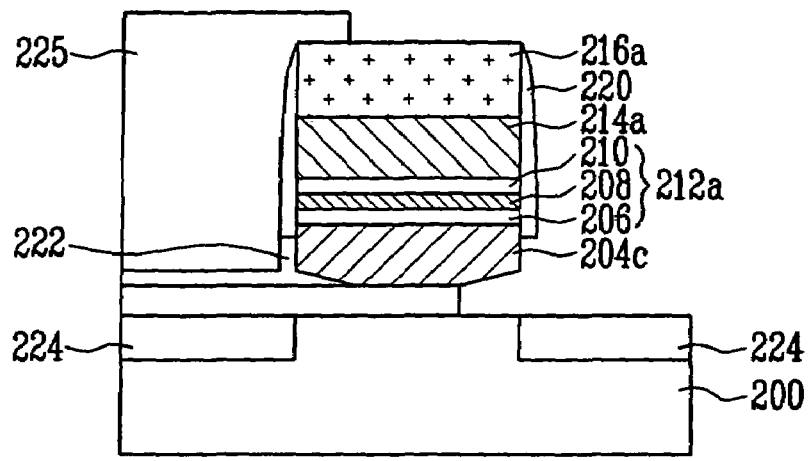
FIGS. 13 to 17 are cross-sectional views showing steps of a method of manufacturing a transistor of a semiconductor device according to a second embodiment of the present invention.

Referring to FIG. 13, a photoresist pattern 225 that shields a first side (left side with respect to the center of a stack type gate) of a stack type gate is formed on a semiconductor substrate 200 in which a thermal oxide film 222 is formed. The thermal oxide film 222 formed in the second side (the right side with respect to the center of the stack type gate) of the stack type gate and a tunnel oxide film 202 below the thermal oxide film 222 are removed at the same time by wet etching using a photoresist pattern 225 as an etch mask. The thermal oxide film 222 that is grown into the bottom of the floating gate from the sidewall of the floating gate and the tunnel oxide film 202 below the thermal oxide film 222 are removed by means of the wet etching. The wet etching can be performed using a HF solution having a high etch rate against the oxide film 222, 202 compared to the capping film 216a, the first spacer 220, the floating gate 204c and the semiconductor substrate 200. Although the wet etching is carried out, the tunnel oxide film 202a below the bottom of the floating gate 204c remains intact.

Figure 14:
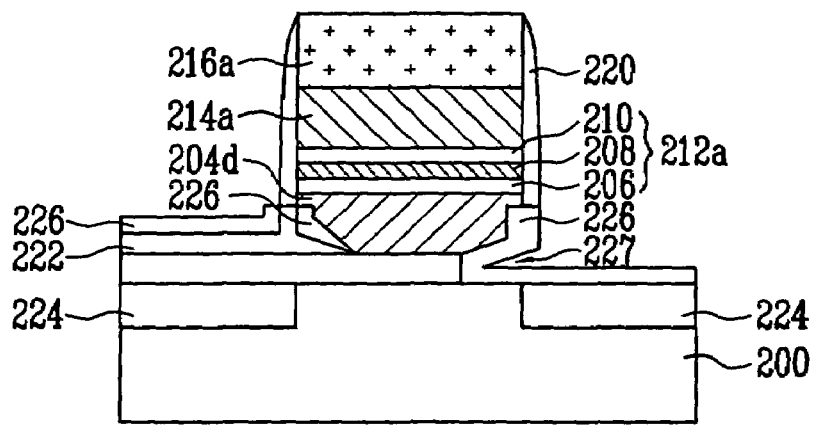

Referring to FIG. 14, the photoresist pattern 225 is removed. Gate oxide films 226 are then grown on the semiconductor substrate 200. The gate oxide films 226 are grown at the side and bottom of the floating gate 204c and on the thermal oxide film 222 in the first side of the stack type gate. At the second side of the stack type gate, the gate oxide films 226 are grown at the side and bottom of the floating gate 204c and on the semiconductor substrate 200. In this time, it is preferred that the thickness of the gate oxide films 226 grown at the side and bottom of the floating gate 204c is thicker than a thickness that is formed on the semiconductor substrate 200. Given gaps 227 are formed between the gate oxide films 226 grown at the side and bottom of the floating gate 204c and the gate oxide films 226 grown on the semiconductor substrate. Further, through formation of the gate oxide films 226, the floating gate 204d has a structure in which first sides of the floating gate 204d come in contact with the first spacer 220, second sides of the floating gate 204d, which have a width narrower than that of the first sides, come in contact with the gate oxide films 226, the bottom of the floating gate 204d comes in touch with the tunnel oxide film 202a, and faces between the bottom and the second sides of the floating gate 204d have an inclined shape of a predetermined tilt while coming in contact with the gate oxide films 226.

Figure 15:
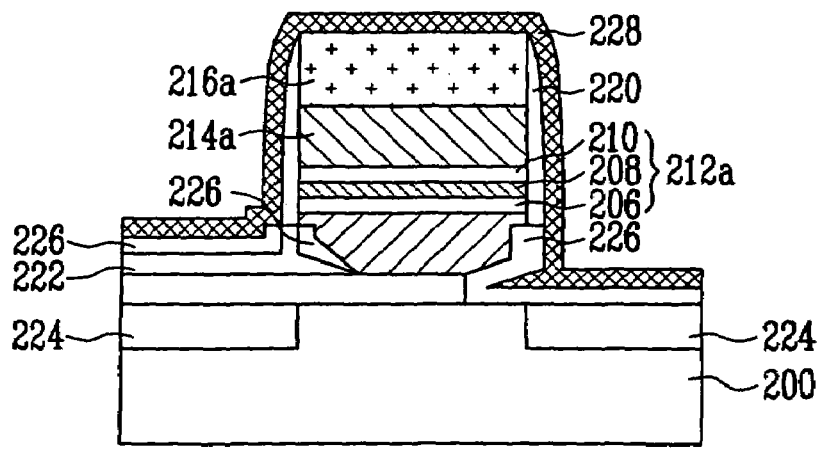

Referring to FIG. 15, a nitride film 228 is deposited on the semiconductor substrate 200 in which the gate oxide films 226 are formed. In this time, the nitride film 228 is deposited even at the gap 227 between the gate oxide films 226.

Figure 16:
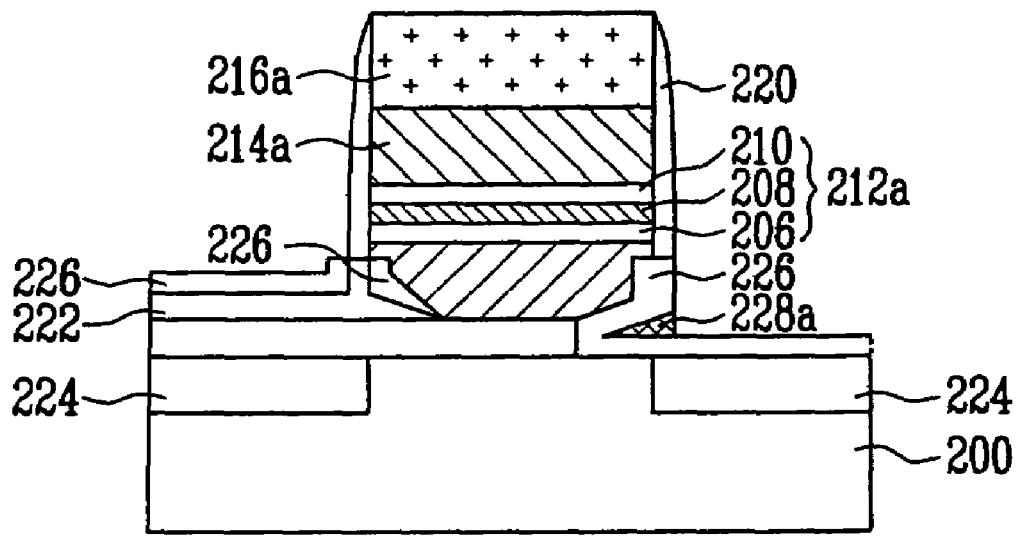

By reference to FIG. 16, the nitride film 228 is etched to leave the nitride film 228 only at the gaps (see '227' in FIG. 14) of the gate oxide films 226. The etching makes the nitride film 228 floated. The nitride film floated thus (hereinafter, referred to as 'floating nitride film') serves as a charge trap center. The etching is preferably wet etching and may use a phosphoric acid ($H_3PO_4$) solution having a high etch rate against the nitride film compared to the gate oxide films 126.

Figure 17:
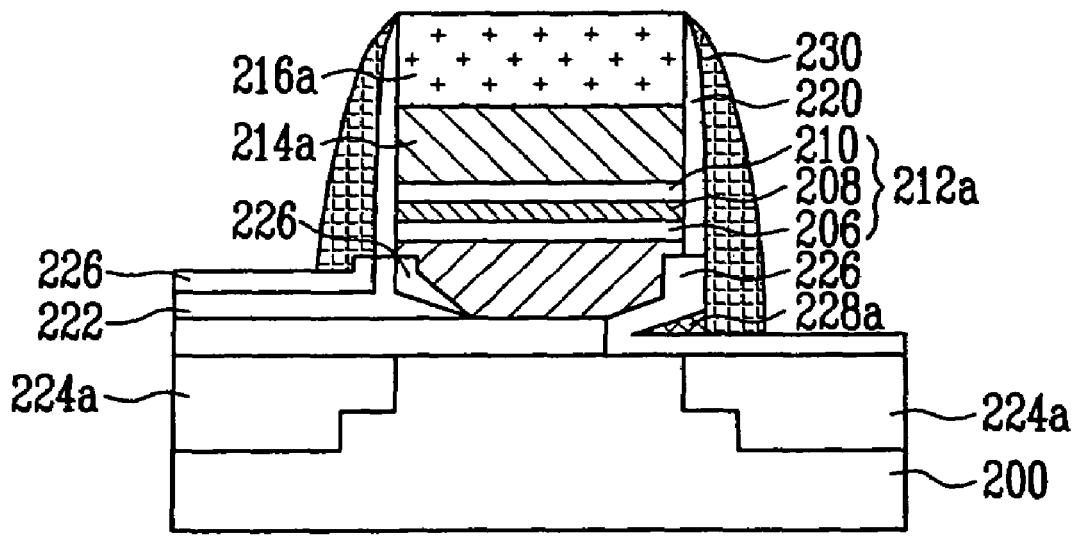

Referring to FIG. 17, after a material film for gate spacer is deposited, anisotropic dry etching is carried out to form second spacers 230 on the sidewalls of the first spacer 220, the gate oxide films 226 and the floating nitride film 228a. The material film for gate spacer can be a silicon nitride film. By forming the second spacers 230, the floating nitride film 228a is completely isolated by the gate oxide films 226 and the second spacers 230.

An impurity of a concentration that is higher than that in the ion implantation for forming the LDD is implanted into the semiconductor substrate 200 in which the second spacers 230 are formed using the capping film 216a and the second spacers 230 as an ion implant mask, thus forming a source/drain electrode 224a in the source/drain region.

Thereafter, interlayer insulating films (not shown), contacts (not shown) and metal wires (not shown) are formed on the semiconductor substrate 200 in which the cell transistor is formed, thereby completing a desired semiconductor device.

As described above, a transistor of a semiconductor device according to the present invention can operate as a 2-bit or 3-bit cell, and 2 bit or 3 bit can be stored in one transistor. In the case of a 1 Gb flash memory device, the number of a cell transistor can be reduced to ½ to ⅓ compared to a flash memory device composed of a conventional single-bit cell. It is thus possible to reduce the cell area to ½ to ⅓.

Further, according to the present invention, a 2-bit cell or 3-bit cell of a high density can be implemented and manufacturing cost can be saved accordingly. It is thus possible to implement a flash memory cell of a high integration level compared to a conventional flash memory cell in terms of charge storage/retention as well as program time.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A transistor of a semiconductor device, comprising:
    a stack type gate comprising a tunnel oxide film, a floating gate having two sides with sidewalls, a dielectric film, and a control gate sequentially stacked on a semiconductor substrate;
    a gate oxide film formed on the semiconductor substrate below the floating gate with respect to the tunnel oxide film, wherein the gate oxide film is formed along the boundary of a portion of a bottom and a side of the floating gate;
    a first spacer formed to cover both sidewalls of the floating gate, the dielectric film, and the control gate; and
    floating nitride films buried at gaps between the gate oxide film formed on the semiconductor substrate and the gate oxide film formed along a boundary of a portion of a bottom and a side of the floating gate,
    wherein the floating nitride films serve as a trap center of a hot charge and store 1 bit charge, and wherein respective first sides at both sides of the floating gate contact the first spacer, respective second sides at both sides of the floating gate contact the gate oxide film, a width between the respective second sides is narrower than a width between the respective first sides, the bottom defines a plane that contacts the tunnel oxide film, and a face between the bottom and the second sides is inclined at a given tilt and contacts the gate oxide film.

2. The transistor of claim 1, further comprising second spacers formed at the sides of the first spacers, the gate oxide film formed at a portion of the bottom and side of the floating gate, and the floating nitride film.

3. The transistor of claim 1, wherein the bottom of the first spacer is lower than the top of the floating gate and higher than the bottom of the floating gate.

4. The transistor of claim 1, wherein the bottom of the first spacer is lower than the top of the floating gate and higher than the bottom of the floating gate, and the face between the first side and the second side of the floating gate and the bottom of the first spacer is located on the same plane.

5. The transistor of claim 1, wherein the floating nitride film has a right-angled triangle shape.

6. The transistor of claim 1, further comprising a capping film formed on the control gate.

7. The transistor of claim 1, further comprising a source/drain electrode formed in the semiconductor substrate at a lower side of the floating gate.

8. A transistor of a semiconductor device, comprising:
    a stack type gate comprising a tunnel oxide film, a floating gate having first and second sides and sidewalls, a dielectric film, and a control gate sequentially stacked on a semiconductor substrate;
    first spacers formed on sidewalls of a portion of the floating gate, the dielectric film, and the control gate;
    a gate oxide film formed at a portion of a bottom and a side of the floating gate and on the semiconductor substrate;
    floating nitride films in which gaps are formed between the gate oxide film formed at a portion of the bottom and side of the floating gate and the gate oxide film formed on the semiconductor substrate, wherein the floating nitride films are buried in the gaps; and
    second spacers formed on sidewalls of the first spacers, the gate oxide film formed at a portion of the bottom and side of the floating gate, and the floating nitride film,
    wherein respective first sides at both sides of the floating gate contact the first spacers, respective second sides at both sides of the floating gate contact the gate oxide film, a width between the respective second sides is narrower than a width between the respective first sides, the bottom of the floating gate defines a plane that contacts the tunnel oxide film, and a face between the bottom and the second sides is inclined at a given tilt and contacts the gate oxide film.

9. The transistor of claim 8, wherein the bottom of the first spacers is lower than the top of the floating gate and higher than the bottom of the floating gate.

10. The transistor of claim 8, wherein, the bottom of the first spacers is lower than the top of the floating gate and higher than the bottom of the floating gate, and the face between the first side and the second side of the floating gate and the bottom of the first spacers is located on the same plane.

11. The transistor of claim 8, wherein the floating nitride film has a right-angled triangle shape.

12. The transistor of claim 8, further comprising a capping film formed on the control gate.

13. The transistor of claim 8, further comprising a source/drain electrode formed in the semiconductor substrate at a lower side of the floating gate.

14. A transistor of a semiconductor device, comprising:

a stack type gate comprising a tunnel oxide film, a floating gate having first and second sides and sidewalls, a dielectric film, and a control gate sequentially stacked on a semiconductor substrate;

a first spacer formed on sidewalls of a portion of the floating gate, the dielectric film, and the control gate;

a thermal oxide film formed on the semiconductor substrate at a bottom of the first side of the floating gate; a gate oxide film formed at a portion of the bottom and a side of the first side of the floating gate and on the thermal oxide film, wherein the gate oxide film is also formed at a portion of the bottom and a side of a second side of the floating gate and on the semiconductor substrate at the bottom of the second side of the floating gate;

floating nitride films in which gaps are formed between the gate oxide film formed at a portion of the bottom and the side of the second side of the floating gate and the gate oxide film formed on the semiconductor substrate at the bottom of the second side of the floating gate, wherein the floating nitride films are buried in the gaps; and second spacers formed on the first spacer and the thermal oxide film at the first side of the floating gate and formed on sidewalls of the first spacer at the second side of the floating gate, the gate oxide film formed at the bottom and side of the floating gate and the floating nitride film, wherein at the second side of the floating gate, the first side of the floating gate contacts the first spacers, the second side of the floating gate contacts the gate oxide film, the bottom defines a plane that contacts the tunnel oxide film, and a face between the bottom and the second side is inclined at a given tilt and contacts the gate oxide film.

15. The transistor of claim 14, wherein the bottom of the first spacer is lower than the top of the floating gate and higher than the bottom of the floating gate.

16. The transistor of claim 14, wherein the gate oxide film contacts the bottom of the first spacer, the face between the first side and the second side, the second side, the face between the bottom of the floating gate and the second side, and the tunnel oxide film.

17. The transistor of claim 14, wherein the floating nitride film has a right-angled triangle shape.

18. The transistor of claim 14, further comprising a capping film formed on the control gate.

19. The transistor of claim 14, further comprising a source/drain electrode formed in the semiconductor substrate at a lower side of the floating gate.

* * * * *